United States Patent [19]

Imura et al.

[11] Patent Number: 4,949,034
[45] Date of Patent: Aug. 14, 1990

[54] METHOD FOR CONTACTLESS EVALUATION OF CHARACTERISTICS OF SEMICONDUCTOR WAFERS AND DEVICES

[75] Inventors: Makoto Imura, Noda; Akira Usami, Aichi, both of Japan

[73] Assignees: Mitsubishi Kinzoku Kabushiki Kaisha; Japan Silicon Co., Ltd., both of Tokyo, Japan

[21] Appl. No.: 322,390

[22] Filed: Mar. 13, 1989

[30] Foreign Application Priority Data

Sep. 7, 1988 [JP] Japan ............................ 63-224279

[51] Int. Cl.$^5$ .................... G01R 31/26; G01R 27/06
[52] U.S. Cl. ......................... 324/158 R; 324/158 D; 324/642
[58] Field of Search .............. 324/158 R, 158 D, 95, 324/58 B, 158 T, 642

[56] References Cited

U.S. PATENT DOCUMENTS 3,939,415  2/1976  Terasawa ..................... 324/158 D

FOREIGN PATENT DOCUMENTS

| 1410917 | 3/1977 | Japan . |
| 1066228 | 3/1978 | Japan . |
| 1115987 | 10/1978 | Japan . |
| 1223676 | 10/1978 | Japan . |
| 1445903 | 9/1982 | Japan . |
| 1433967 | 3/1983 | Japan . |
| 61173171 | 1/1985 | Japan . |
| 61174733 | 1/1985 | Japan . |

Primary Examiner—Ernest F. Karlsen
Attorney, Agent, or Firm—Cushman, Darby & Cushman

[57] ABSTRACT

This invention discloses a method for contactless evaluation of characteristics of semiconductor wafers and devices. The method includes the steps of (a) continuously irradiating focused microwaves on a surface of a semiconductor specimen; (b) continuously receiving reflected microwaves reflected from said surface; (c) irradiating a focused laser beam pulse on the specimen, energy of the pulse being in excess of the band-gap energy of the semiconductor material; (d) measuring lifetime $\tau_m$ from the time-history of the characteristics of the reflected microwaves; and (e) calculating the surface recombination velocity S and bulk lifetime $\tau_b$. The focused microwaves and focused laser beam can improve the resolution during measurement. Furthermore, the method includes the steps of: (a) continuously irradiating microwaves on a surface of a semiconductor specimen; (b) continuously receiving reflected microwaves reflected from said surface; (c) irradiating a laser beam pulse on the specimen, energy of the pulse being in excess of the band-gap energy of the semiconductor material; and (d) changing the characteristic of the reflected microwaves to an electrical signal, for obtaining the intensity of the reflected microwaves at a predetermined moment, repeating those steps at a plurality of points on the surface, thereby obtaining electrical signals at the points according to surface recombination velocities S at the points, so that the surface condition of the specimen can be evaluated.

28 Claims, 8 Drawing Sheets

FIG.1
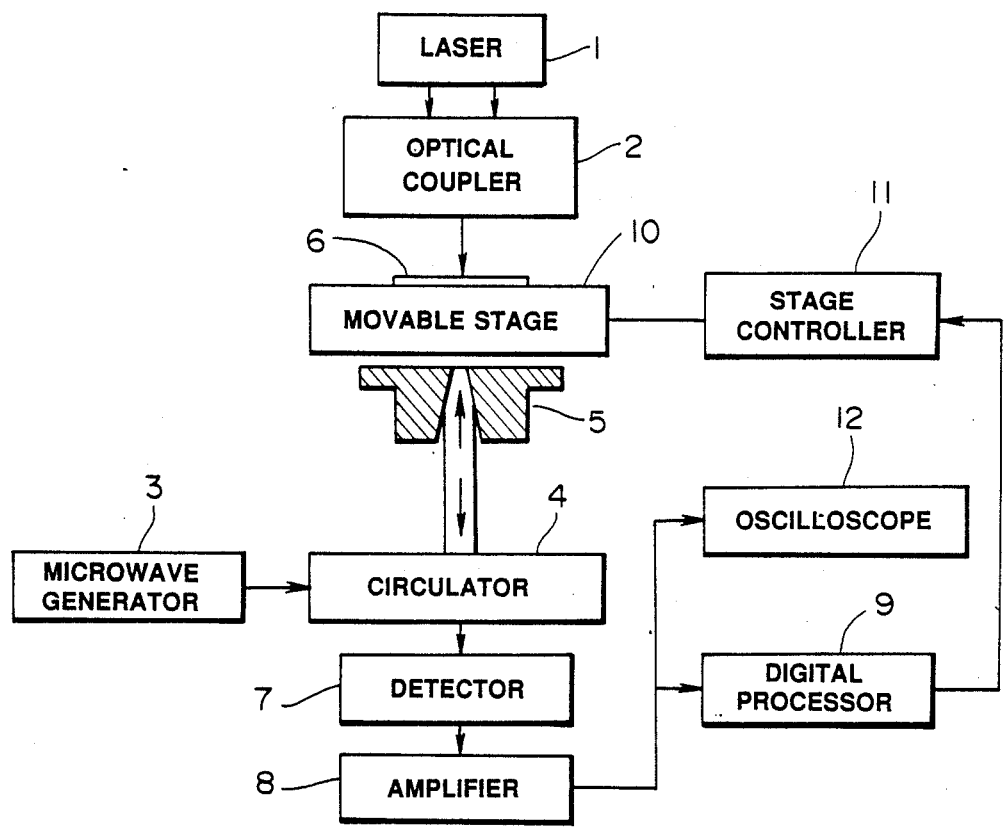
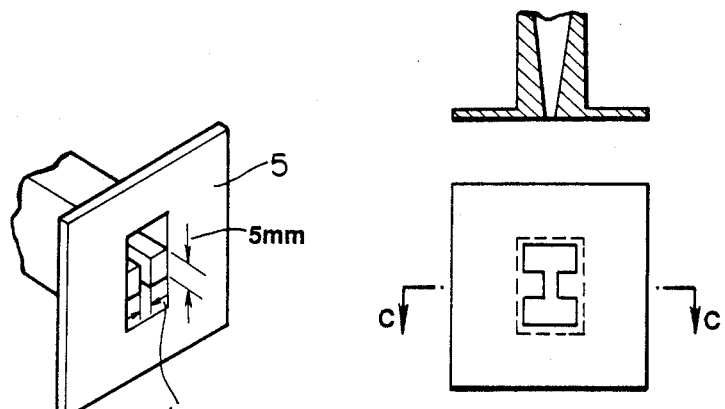
FIG.2A  FIG.2C
FIG.2B

METHOD FOR CONTACTLESS EVALUATION OF CHARACTERISTICS OF SEMICONDUCTOR WAFERS AND DEVICES

BACKGROUND OF THE INVENTION

This invention relates to a method for contactless evaluation of the characteristics of semiconductor wafers and devices, such as evaluation of surface contamination by heavy metals or other contaminants, bulk contamination because of diffusion of the contaminants, mechanical surface damage, subsurface crystal defects, or damage by ion implantation. This invention more specifically relates to an improvement of contactless measurement of photoinduced carrier lifetime and surface recombination velocity of the semiconductor wafers made of silicon.

For evaluation of characteristics of semiconductor wafer, measurement of carrier lifetime is advantageous. Several contactless methods for the lifetime measurement have been developed, such as diffusion length measurement, the photocurrent method, and the widely used photoconductivity decay method. The photoconductivity decay method has become the technique most used to characterize the ingot material, etc. The present inventors have proposed various inventions relating to a photoconductivity decay method, which will be described hereinafter.

An example of the photoconductivity decay method was proposed in Japanese Patent Application Examined (kokoku) No. 61-60576. The method is as follows:

(1) A microwave generator continuously irradiates microwaves via a wave guide to the surface of a wafer.

(2) A pulsed light source applies a light pulse to the surface of the wafer, thereby exciting carries in the wafer.

(3) The generated excess carriers increase the conductivity of the wafer, thereby the reflected components of the incident microwaves are thereby modulated by the varying conductivity, e.g. the phase of the microwaves is effected.

(4) When the light pulse has ceased, the majority and minority carriers recombine to reach the equilibrium state. Over the time course of this reequilibration, the absorption of incident microwaves likewise returns to its pre-excitation state.

(5) As the above process occurs, a detector collects the modulated microwaves reflected from the surface of the wafer via the wave guide. The detector continuously transforms the changing phase of the reflected microwaves to an electrical signal and outputs the signal. An oscilloscope connected to the detector displays decay curve which graphically illustrates the time course of the electrical signal that shows the changing phase of the microwaves which represents the recombination time course of the minority and majority carriers.

(6) The carrier lifetime of the wafer can be computer-calculated by referring to the decay curve. In this case, carrier lifetime is calculated as time for the electrical signal of the detector to decay to 1/e wherein e is the base of the natural logarithm.

Next, Japanese Patent Application Examined (kokoku) No. 58-57907 will be described. In general, the actually measured lifetime $\tau_m$ is defined by formula (1):

$$\frac{1}{\tau_m} = \frac{1}{\tau_b} + \frac{1}{\tau_s} \tag{1}$$

where $\tau_b$ is bulk lifetime, mostly determined by crystalline perfection of the wafer, $\tau_s$ is surface lifetime determined by the surface condition of the wafer which may be effected by machining damage, crystal defects and surface contamination. Surface lifetime $\tau_s$ is inversely proportional to surface recombination velocity S. With higher surface recombination velocity S, induced excess carriers diffuse and recombine more rapidly at the surface, thereby measured lifetime $\tau_m$ is frequently too lower to be measured. To evaluate crystal characteristics of the wafer by measuring lifetime $\tau_m$, it is necessary to reduce the surface recombination velocity S. Because in wafer-like semiconductors, large number of the induced excess carriers diffuse and recombine at the surface, a positive charge coating method which is disclosed in Japanese Patent Application Examined (kokoku) No. 58-57907 is now utilized in order to lower surface recombination velocity S. In this method, positive ions such as tin chloride are implanted into the surface of n-type semiconductor. The positive ions combine with induced electrons (minority carriers) to restrict the recombination of holes (majority carriers). Thereby, the surface recombination velocity S is lowered. Therefore, the measured lifetime $\tau_m$ may be regarded as the bulk lifetime $\tau_b$. Also, a negative charge coating method is utilized in order to lower surface recombination velocity S. In this method, negative ions are implanted into the surface of p-type semiconductor. The negative ions combine with induced holes (minority carriers) to restrict the recombination of electrons (majority carriers). Thereby, the surface recombination velocity S is lowered. Therefore, the measured lifetime $\tau_m$ may be regarded as bulk lifetime $\tau_b$. At present, precise heat annealing is achieved to make a regular oxide layer on the surface of the semiconductor wafer and device by the wafer and device manufacturers. A barrier of surface state is made at the boundary surface between the oxide layer and the bulk. Because the electrons and holes are charged at the boundary in P-type silicon and N-type silicon respectively, the surface recombination velocity S is constantly restricted to achieve more precise bulk lifetime measurement. The present lifetime measurement using microwave is utilized for examination of the effect of heat annealing or evaluating the operating condition of heat annealing furnaces. However, in both methods, the specimen which is used for measurement may not then be used for a wafer or semiconductor device.

Because in the above methods, the specimen which is used for measurement cannot later be used as a wafer or semiconductor device, Japanese Patent Application Examined (kokoku) No. 62-53944 was developed as technique for contactless measurement of bulk lifetime and surface recombination velocity of wafers in which the surface has been ground and which may be actually utilized as semiconductor material in that condition. Japanese Patent Application Examined No. 62-53944 discloses a method for calculation of bulk lifetime $\tau_b$ and surface-recombination velocity S by computer-analysis of lifetime $\tau_m$ measured after irradiation of the wafer with a light pulse generator. The method is as follows:

When excess carriers decay after irradiation by a light pulse, concentration-distribution of carriers is according to formula (2).

$$\frac{\partial \Delta p(x, t)}{\partial t} = \frac{D \partial^2 \Delta p(x, t)}{\partial x^2} - \frac{\Delta p(x, t)}{\tau_b} \quad (2)$$

where D is the diffusion coefficient defined by the specimen material, $\Delta p(x, t)$ is the excess carrier concentration, x is depth from the surface irradiated by light, and t is elapsed time after beginning the irradiating by the light pulse. The boundary condition of formula (2) is determined according to formulas (3) and (4).

$$\frac{D \partial \Delta p}{\partial x} = S \Delta p(0, t) \quad (3)$$

$$\frac{D \partial \Delta p}{\partial x} = -S \Delta p(w, t) \quad (4)$$

where w is the thickness of the wafer. If these formulas are transformed and the measured lifetime $\tau_m$ is substituted, then the surface recombination velocity S and bulk lifetime $\tau_b$ may be calculated separately.

At present, as a method for evaluation of the characteristics of semiconductor wafer, a combination of Japanese Patent Applications Examined No. 61-60576 and 58-57907 which are for measurement of bulk lifetime $\tau_b$ is utilized. Also, Japanese Patent Application Examined No. 62-53944 which is for obtaining bulk lifetime $\tau_b$ and surface recombination velocity S after measurement of lifetime $\tau_m$ is utilized.

However, up to now, surface resolution of measurement for lifetime $\tau$ and/or surface recombination velocity S has been limited to no less than 2 mm by current methods, therefore accuracy in measurement is not adequate.

On the other hand, the method for separately calculating bulk lifetime $\tau_b$ and surface recombination velocity S disclosed in Japanese Patent Application Examined No. 62-53744 needs complex analysis to obtain results for a measuring point. Therefore, applying the method to many points over the wafer surface requires enormous time. Consequently, the method is not practical for "on-line" evaluation of wafers.

In recent years, semiconductor device manufacturing methods have become more precise, shallower areas must be joined with each other and function properly, and the semiconductor material is employed at a depth of only a few $\mu$m from its surface. Thus, it is essential to evaluate the characteristics of these areas and to monitor surface conditions "on-line" before and during the semiconductor device manufacturing process. For example, junctions in 1 megabyte CMOS type DRAM are at a depth of 0.2 $\mu$m. Therefore it is sufficient to measure the characteristics of shallower areas such as 2 or 3 $\mu$m from surface, and measurement of deeper areas is not only unnecessary but undesirable.

SUMMARY OF THE INVENTION

Accordingly, it is an object of the present invention to provide a method for contactless evaluation of characteristics of semiconductor wafers and devices in which the resolution is sufficiently high.

Another object of the present invention is to provide a method to shorten the time for the measuring so as to be useful for "on-line" measurement.

Yet another object of the present invention is to provide a simplified method for contactless evaluation of characteristics of semiconductor wafer and devices in shallower regions such as a few $\mu$m from the surface.

According to the method of the present invention, microwaves which are focused by a wave guide continuously irradiates the surface of the specimen. A laser beam pulse whose energy is in excess of the band-gap energy of the semiconductor material irradiates the semiconductor to excite carriers. The reflected microwaves from the surface are modulated by exciting carriers, and captured. The changing of the microwaves are then transformed into an electrical signal. Measured lifetime $\tau_m$ is obtained from time course of the electrical signal, thereby surface recombination velocity S and bulk lifetime $\tau_b$ is calculated. Resolution of measurement is improved by fine focusing the microwaves using ridge waveguide which has a microwave passage tapering to a microwave portal facing the specimen. Furthermore, the laser beam pulse is finely focussed by passing it through an optical fiber. Thereby, the concentration of minority carriers is increased, and consequently the resolution is improved.

Furthermore, when a He-Ne laser beam is employed for the laser beam pulse, the laser beam penetrates to shallower regions, such as 2 or 3 $\mu$m from the surface, thereby exciting carriers at a similar depth. The electrical signal is not effected by the bulk lifetime $\tau_b$ but effected by the surface recombination velocity S. Accordingly, only measuring the electrical signal is necessary for evaluations the surface condition. Thereby, the calculation process for bulk lifetime $\tau_b$ and surface recombination velocity S can be omitted so that quicker measurement at the surface of the wafer is possible. Even if the specimen is a large wafer, evaluation time for the whole surface can be shortened. The method is suitable for 'on-line' monitoring in semiconductor device manufacturing processes.

BRIEF DESCRIPTION OF THE DRAWINGS

With reference to the accompanying drawing:

FIG. 1 is a schematic block diagram of a measurement device for contactless evaluation of the characteristics of semiconductor wafers and devices, according to an embodiment of the present invention.

FIG. 2 (A) is a perspective illustration of a ridge wave guide used in the measurement device. FIG. 2 (B) is a front view of the wave guide. FIG. 2 (C) is a cross sectional view of the wave guide taken along the line C—C of FIG. 2 (B).

DETAILED DESCRIPTION OF THE PREFERRED EMBODIMENTS

Figure 3:
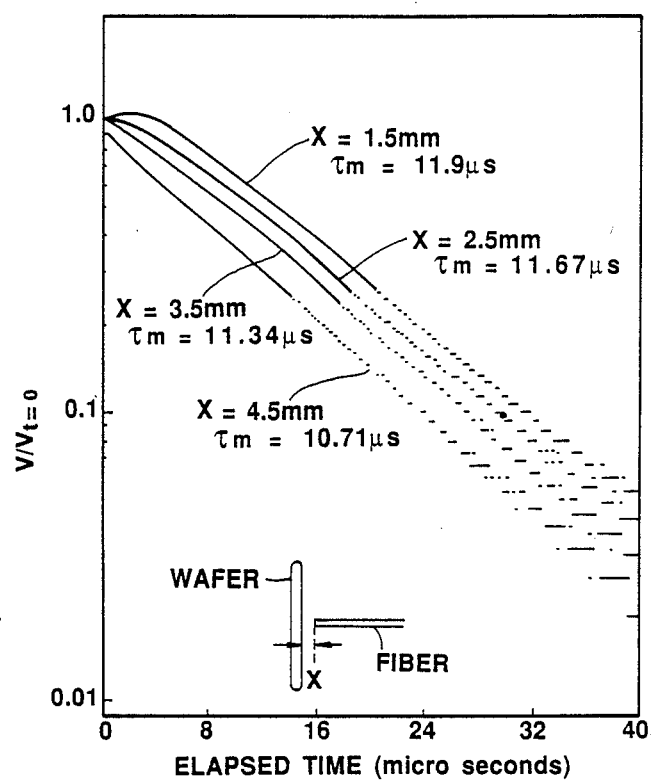
FIG. 3 is a graph showing normalized decay curves representing decay of reflected microwaves for different distances between the optical fiber and the wafer.

A measurement apparatus for the method according to the invention, is generally outlined in FIG. 1, with the laser indicated by No. 1. If laser 1 emits continuous wave, laser 1 includes a chopper (not shown). Laser 1 emits a laser beam passing through optical coupler 2, directed at a surface of silicon semiconductor wafer 6 fixed on movable stage 10. Numeral 3 denotes a microwave generator for generating microwaves at 10 GHz. The microwaves are focused by passing through circulator 4 and ridge waveguide 5 and then directed to a surface of wafer 6. The point which is irradiated by the laser beam and the point at which the microwaves are directed are located directly opposite each other each on a respective surface of wafer 6. The microwaves are reflected from the surface and then return through ridge waveguide 5 and circulator 4, and are transmitted to microwave detector 7. Detector 7 emits and electric signal according to variation of the microwave's phase. The signal from detector 7 is transmitted to a digital processor 9 and oscilloscope 12 via amplifier 8. The processor 9 has a microcomputer and a display which shows time-history of the signal. Movable stage 10 is horizontally driven by stage controlled 11 in intervals, e.g. an interval of 100 μm. The stage controller 11 holds position data of the movable stage 10. The position data is transmitted to digital processor 9.

Ridge waveguide 5, as shown in FIGS. 2 (A), (B), and (C), has a passage for microwaves, which is of an H-shaped cross section and whose center portion tapers to a microwave portal facing to wafer 6. Because of the shape of ridge waveguide 5, a wide range of frequencies can be transmitted therethrough and ridge waveguide can focus the microwaves.

One method according to the present invention for contactless measurement of photoinduced carrier lifetime and recombination velocity of the surface of semiconductor wafers is as follows:

(1) Microwave generator 3 continuously irradiates a surface of wafer 6 through circulator 4 and waveguide 5.

(2) Detector 7 continuously receives reflected microwaves from the surface of wafer 6.

(3) Laser 1 irradiates the opposite surface of wafer 6 with a laser beam pulse whose energy is in excess of the band-gap energy of the semiconductor material.

(4) Detector 7 continuously converts the energy of the reflected microwaves to an electrical signal and outputs the signal to digital processor 9 and oscilloscope 12.

(5) Digital processor 9 obtains measured lifetime $\tau_m$ from the decay condition of the electrical signal of detector 7.

(6) Digital processor 9 further calculates bulk lifetime $\tau_b$ and surface recombination velocity S from the lifetime $\tau_m$.

During the above process, the point which is irradiated by the laser beam and the point at which the microwaves are directed are located directly opposite each other each on respective surfaces of wafer 6. It is also possible for the laser beam and microwaves to be directed to same point on the same surface.

EXPERIMENTS 1

The concentration of injected photons seems to be an important factor when irradiating a semiconductor wafer with a laser beam. An experiment conducted with the above apparatus including a laser diode, in which the laser beam is focused by an optical fiber with varying distance between the pointed end of the fiber and the surface of the wafer will now be described. The conditions of the experiment are as follows:

The laser 1 is a laser diode which emits a laser beam pulse at a wavelength of 904 nm for a time interval of 200 nanoseconds. The beam, whose original diameter is 2 mm, is focused by passing it through an optical fiber (not shown) whose core diameter is 50 μm and irradiated on the surface of wafer 6. Wafer 6 is a silicon wafer whose conductivity p is 1000 ohm·cm and whose orientation is (1 1 1). The microwaves from the microwave generator 3 are applied to the opposite surface of the wafer 6. The distance X between the pointed end of the optical fiber and silicon wafer 6 is varied as 1.5 mm, 2.5 mm, 3.5 mm, and 4.5 mm through the experiment. FIG. 3 shows the result of the experiment. In FIG. 3, the vertical axis shows elapsed time from the end of the laser beam pulse interval, and the horizontal axis shows the normalized voltage ratio $V/V_{t=0}$; V is the voltage of the signal generated by the detector 7, and $V_{t=0}$ is the voltage V when the elapsed time since the laser pulse is equal to 0. The reason for using $V/V_{t=0}$ is that the longer the distance X, the broader the beam diameter, similar to a cone, and the less the number of absorbed photons per unit area. Therefore, the concentration of carriers is reduced.

Referring to FIG. 3, $\tau_m$ is the measured lifetime obtained from each of the tail portions of the decay curves in such a manner that $\tau_m$ is the time for the voltage to decay to 1/e where e is the base of the natural logarithm. The measured lifetime $\tau_m$ is relatively independent of the distance X for most of the curve. However, the initial portions of the decay curves vary to a greater degree depending on the distance X and do not have a constant decay trend. The peak values of the signal are observed at a few microseconds after the finish of the emission of the laser beam pulse. (Only the curve for X=4.5 mm reaches a maximum value at the point where elapsed time equals zero.) Because the measured lifetime $\tau_m$ is defined as time for the voltage to decay to 1/e, it is not obtainable from the curves represented in FIG. 3. Therefore, the bulk lifetime $\tau_b$ and the surface recombination velocity S can not be calculated from FIG. 3 as it is.

Figure 4:
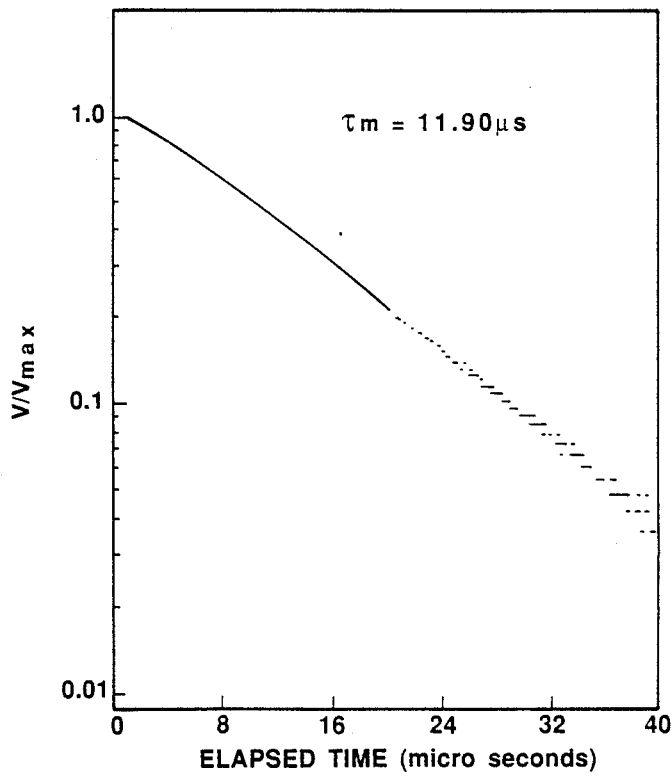
FIG. 4 is a graph replotted from FIG. 3 where the vertical axis is $V/V_{max}$ and each curve is shifted along the abscissa so that its peak coincides with the ordinate.

Accordingly, in FIG. 4, the curves representing the same experimental data as in FIG. 3, for X=1.5 mm, 2.5 mm, and 3.5 mm are replotted, using $V/V_{max}$ for the vertical axis where $V_{max}$ is the maximum peak value of the voltage, and shifting each graph along the abscissa so that the peak of the curve coincides with the ordinate. In this representation, the curves are seen to nearly overlap. Carrier lifetime $\tau(\tau_m)$ may then be measured from the newly co-inciding curves. Therefore, bulk lifetime $\tau_b$ and surface recombination velocity S can be calculated with a high degree of accuracy.

Figure 5:
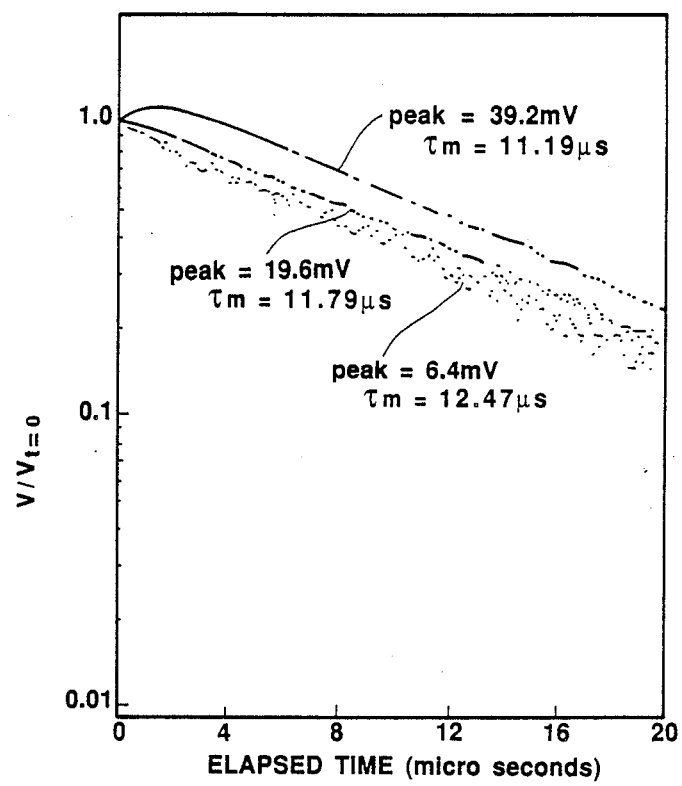
FIG. 5 is a graph showing normalized decay curves representing decay of reflected microwaves with changing output voltage of the laser.

FIG. 5 is a graph showing the results of another experiment. In this experiment, the distance X between the end of the fiber and the silicon wafer 6 is equal to 0 mm, that is, the end of the fiber and the wafer are in contact. Otherwise, the conditions are the same as for the experiment shown in FIG. 3. In order to vary the concentration of the injected photons, the output level of the laser diode 1 is changed in the experiment. In FIG. 5, the vertical axis and the horizontal axis are defined the same as in FIG. 3. The peak of the voltage of the signal from the detector 7 varies as 39.2 mV, 19.6 mV, and 6.4 mV according to the output level of the laser diode 1. The measured lifetime $\tau_m$ obtained from tail portion of each of the decay curves is relatively independent of the concentration of the carriers and is between 11 and 13 microseconds. When the peak voltage of detector 7 is 19.6 mV or 6.4 mV, the signal from the detector 7 is so small that signal-noise ratio becomes unacceptably bad, so that the calculation of bulk lifetime $\tau_b$ and surface recombination velocity S, from measured lifetime $\tau_m$ obtained from these curves is undesirable. When the highest voltage, 39.2 mV, is output from the detector 7, the concentration of the carriers in the wafer 6 is the highest. In that case, the peak value of the signal is observed at a few microseconds after the finish of the emission of the laser beam pulse, that is, the shape of the decay curve for 39.2 mV-peak is same as the curve in FIG. 3 for the distance X≦2.5 mm. In that case, because measured lifetime $\tau_m$ is obtained from only the tail portion of the curve, the calculation of surface recombination velocity S and the bulk lifetime $\tau_b$ is not optimal as well.

Figure 6:
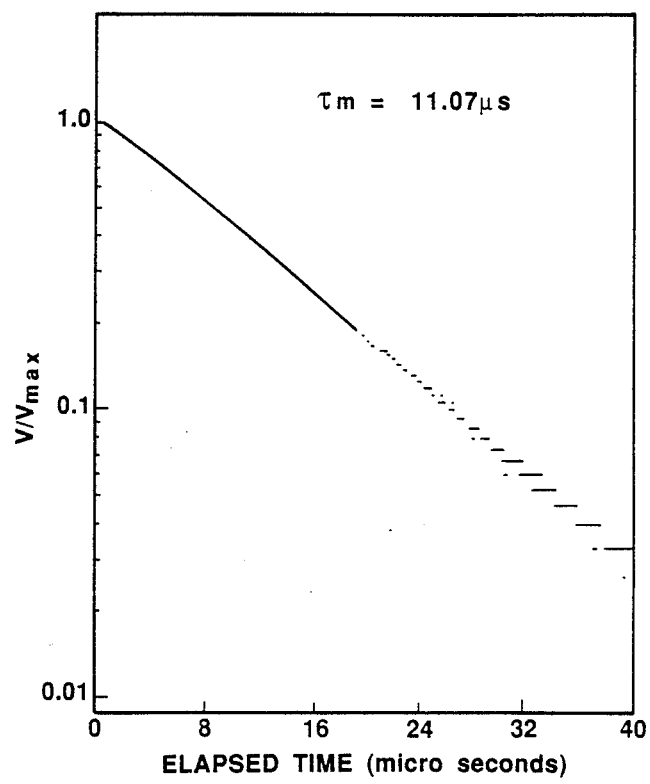
FIG. 6 is a graph replotted from FIG. 5 where the vertical axis is $V/V_{max}$ and each curve is shifted along the abscissa so that its peak coincides with the ordinate.

In FIG. 6, the curves represent the same experimental data as in FIG. 5 are replotted using $V/V_{max}$ for the vertical axis and shifting each curve along its abscissa so that the peak of the curve coincides with the ordinate. In this representation, the curves are seen to nearly overlap, similar to FIG. 4. Therefore, carrier lifetime $\tau(\tau_m)$ may be measured from entire coinciding curves. Therefore, bulk lifetime $\tau_b$ and surface recombination velocity S can be calculated with high degree of accuracy.

It is understood from the above experiments that if the concentration of injected carriers is appropriately adjusted with focusing the laser beam by passing through the optical fiber, changing the distance between the end of the optical fiber and the wafer, and adjusting the output of the laser, the concentration of carriers is accordingly adjusted. Shifting each graph along the abscissa so that the peak of the curve coincides with the ordinate results in a reliable measured lifetime $\tau_m$. Therefore bulk lifetime $\tau_b$ and surface-recombination velocity S can be calculated, whether the laser beam pulse is focused through the optical fiber or not. The results of measured lifetime $\tau_m$ and calculated surface recombination velocity S are as follows:

$\tau_m$=10.71 μs, S=348 cm/sec.

The precalculated values without optical fiber, which are almost same, are as follows:

$\tau_m$=9.79 μs, S=314 cm/sec.

EXPERIMENT 2

Next, experiments to observe the resolution using a laser diode will be described. The conditions are as follows:

Specimen of the wafer 6: The bulk is n-type silicon whose conductivity ρ is 1000 ohm·cm and orientation is (1 1 1). The specimen surface is covered with 500 Å-thick $SiO_2$. A half of the surface is ion-implanted with P+ (phosphorus) ions at a concentration of $10^{13}$ cm$^{-2}$ to be an n+ region so as to create an n±n junctioned surface. The specimen is then heat annealed at a temperature of 1000° C. for 60 minutes.

The laser beam: the laser 1 is a laser diode. The beam of 2 mm diameter is not focused by optical fiber.

Figure 7:
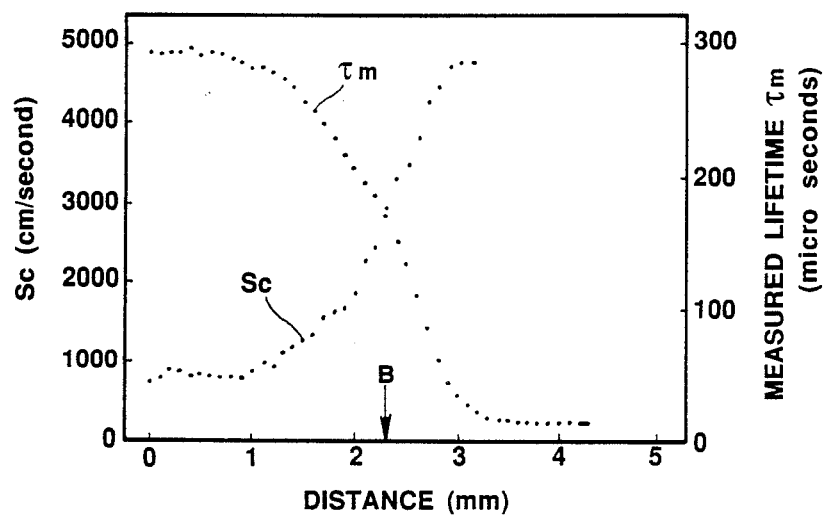
FIG. 7 is a graph showing the distribution of measured lifetime $\tau_m$ and calculated surface recombination velocity $S_c$ based on $\tau_m$ in the neighborhood of the boundary of the ion-implanted region and non-implanted region in an ion-implanted specimen for analyzing measurement resolution.

The specimen is manufactured by the most common method for manufacturing semiconductor devices and one of the purposes of the experiment is to determine whether the method for measurement of lifetime and surface recombination velocity is effective for an actual semiconductor device or not. FIG. 7 shows measured lifetime $\tau_m$ at 100 μm-pitch and surface recombination velocity S calculated using lifetime $\tau_m$. In FIG. 7, mark B is the boundary of the ion-planted region and the non-implanted region. The left portion is the ion-implanted region (n+ region), the right portion the non-implanted region (normal n region). It is expected from Japanese Patent Application Examined No. 58-57907 that P+ ions combine with electrons (majority carriers) excited by the laser beam in the ion-implanted region, thereby recombination of holes (majority carriers) is restricted to the lower surface recombination velocity S. As expected, it is confirmed that surface recombination velocity S at the ion-implanted region is low and a good high-low junction is established. The surface recombination velocity S at the boundary is an intermediate value between that of the ion-implanted and the non-implanted regions. The surface recombination velocity S becomes stable in both regions at a distance of approximately 1 mm from the boundary. Thus, for a laser beam diameter of 2 mm and ridge waveguide width of 1 mm, it is understood that resolution is dependent on the microwave's diameter. Measured lifetime $\tau_m$ is inversely proportional to the surface recombination velocity S according to formula (1) described previously. To establish the relation between resolution and the focusing microwaves, another test with same condition as described above, but without focusing of the microwave is tried. It is seen that measured lifetime $\tau_m$ does not clearly change with variation of the measuring point (the ion-implanted region, boundary, and the non-implanted region) indicating a decrease in resolution.

Thus, focusing microwaves by passing through ridge waveguide 5 which has a microwave passage tapering to the specimen improves the resolution. Furthermore, the focusing enables accurrate detection of the location of the boundary of the high-low junction of the semiconductor.

EXPERIMENT 3

Figure 8:
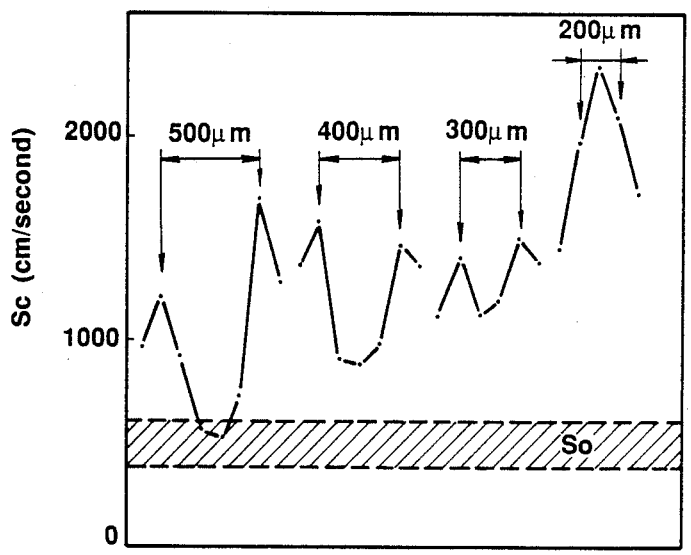
FIG. 8 is a graph showing the distribution of calculated surface recombination velocity $S_c$ based on $\tau_m$ of a specimen which has surface scratches spaced at various intervals for analyzing measurement resolution.
Figure 9:
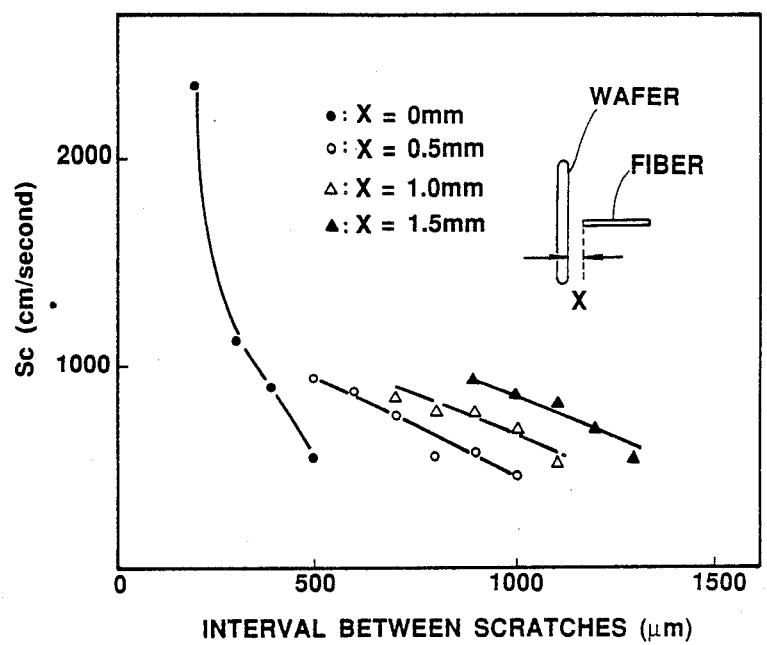
FIG. 9 is a graph showing calculated surface recombination velocity $S_c$ based on $\tau_m$ of a specimen which has surface scratches spaced at various intervals against distances between the end of the optical fiber and the specimen, for analyzing measurement resolution.

FIG. 8 shows the distribution of calculated surface recombination velocity $S_c$ on the surface of a silicon wafer which has been inscribed by pairs of parallel lines. These scratches mimic damage at conveying or scrubbing the wafer. The silicon wafer's conductivity $\rho$ is 1000 ohm·cm and its orientation is (1 1 1). The inscribed lines are straight lines spaced at intervals of 500 $\mu$m, 400 $\mu$m, 300 $\mu$m, and 200 $\mu$m. In FIG9 8, $S_0$ shows the surface recombination velocity S of a wafer without a scratch.

When the scratches are spaced at an interval of 500 $\mu$m, calculated surface recombination velocity $S_c$ reaches a much higher point at the scratches and reaches a lower point equal to $S_0$ at the intermediate point between the scratches. This indicates that the scratches cause defects which raise the surface recombination velocity S.

On the other hand, if the scratches are spaced at interval of 400 $\mu$m or 300 $\mu$m, the calculated surface recombination velocity $S_c$ at the intermediate point between the scratches is lower than at the scratches, but higher than $S_0$. If the interval is 200 $\mu$m, the calculated surface recombination velocity $S_c$ at the intermediate point where there should be no defects is higher than at scratches. These facts indicate the limit of the resolution of the measurement. From a different experiment, the inventors know that diffusion ability of the minority carriers is 200 $\mu$m to 220 $\mu$m. If the diameter of the laser beam defines the resolution, the diameter is 50 $\mu$m so that the interval which does not influence calculated surface recombination velocity S equals 2 * (200 to 220)+50 $\mu$m, that is, at least 450 $\mu$m. Therefore, results in FIG. 8 suggest that the laser beam diameter defines the resolution.

FIG. 9 shows the relation between the calculated surface recombination velocity $S_c$ at the intermediate point between the scratches and the interval of the scratches, changing distance X between the wafer and the optical fiber that focuses the laser beam. In FIG. 9, black spots indicate X=0 mm, white spots X=0.5 mm, white triangles X=1.0 mm, and black triangles X=1.5 mm. At distance X=0 mm, if the interval is shorter, calculated surface recombination velocity $S_c$ is higher, and if the interval is 500 $\mu$m, $S_c$ is the same as the surface recombination velocity $S_0$ in a wafer without a scratch. It is same as in FIG. 8.

On the other hand, if the distance X is longer (0.5 mm, 1.0 mm, 1.5 mm), calculated surface recombination velocity $S_c$ becomes independent on the intervals. For example, at X=1.5 mm, the interval between scratches needs to be at least 1300 $\mu$m in order to decrease the surface recombination velocity $S_c$ to $S_0$. These observations seem to be due to the fact that the laser beam broadens like a cone after leaving the optical fiber.

According to above experiment, it is confirmed that the small beam diameter is necessary for improved resolution, and the closer the end of the fiber and the wafer, the better the resolution when utilizing an optical fiber. In light of FIG. 7 and above experiment, focusing microwaves and reducing laser beam diameter improves resolution. Furthermore, the method is practically useful for detecting damage from conveying or scrubbing of wafers.

While a laser diode is used for exciting carriers in the above experiments, other lasers which emit near infrared can be used because near infrared laser beams penetrate to a depth on the order of magnitude of 10 $\mu$m.

EXPERIMENT 4

The laser beam, whose wavelength is about 904 nm, from the laser diode penetrates to a depth of about 70 $\mu$m from the surface of the wafer. The laser beam whose wavelength is about 633 nm, from the He-Ne laser, penetrates to a depth of 2 to 3 $\mu$m from the surface of the wafer. The minority carriers are distributed as an exponential function in such a manner that the shallower, the higher the concentration directly after injection. Because the carriers diffuse gradually, a He-Ne laser beam which penetrates less deeply is sensitive to surface recombination. The calculation of the surface recombination velocity S at one point on the surface with laser diode beam pulses whose wavelengths are 904 nm requires plotting the decay curve, then determining the measured lifetime $\tau_m$ from the decay curve, then calculating the process of surface recombination velocity S from $\tau_m$, thereby spending five or six seconds. In contrast, if a He-Ne laser beam whose wave length is 633 nm is utilized, surface recombination velocity S can be approximately determined by measuring output signal of detector 7, which corresponds to change of phase of the reflected microwaves, because the laser beam is sensitive to surface recombination. As the result of this measuring method, the analysis of the characteristics at a point on the surface requires less than one second. It is possible to accelerate movement of movable stage 10 to enable continuous scanning. In recent years, extremely shallow regions of semiconductor devices have been more and more utilized in integrated circuits. For this reason, a He-Ne laser beam which is sensitive to surface recombination is very advantageous. This technique is not, however, limited to He-Ne laser, lasers whose wavelength is in region of visible light or less may be used. A He-Cd laser beam whose wavelength is about 442 nm, an Argon laser whose wavelength is about 488 nm, or a YAG laser beam whose wavelength is about 532 nm can be used, for example.

Figure 10:
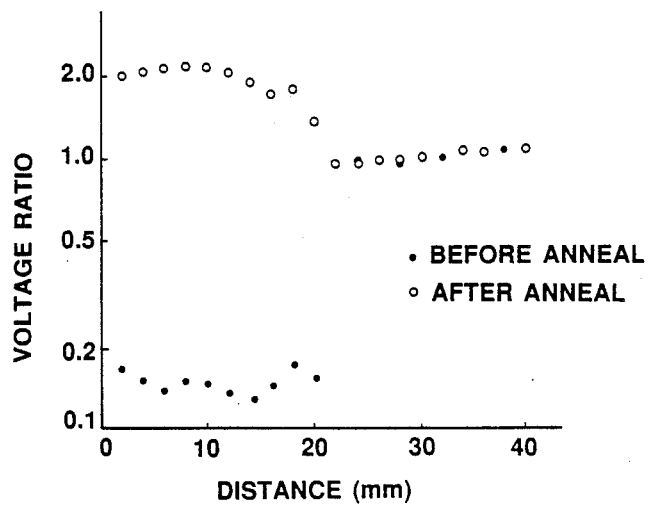
FIG. 10 is a graph showing the distribution of the signal voltage of detector 7 before and after heat annealing using with a He-Ne laser beam to plot resolution against changing concentration of light.

Experiments for comparison between a laser diode and a He-Ne laser will be described here. An experiment using a He-Ne laser 1 was done using the same specimen as in the experiment represented in FIG. 7. The He-Ne laser beam has 2 mm diameter without focusing and a wavelength of 633 nm. The laser beam is chopped by the chopper so as to produce pulses whose wave width of 2.5 microseconds, with a duty factor of 0.5, and a frequency of 200 Hz. FIG. 10 shows distribution of the maximum voltage ratios of the signal from detector 7. In FIG. 10, the vertical axis shows the voltage ratio where the voltage of the signal at non-implanted region is as the base value 1, and the black and white spots show the voltage ratios before heat annealing and after heat annealing respectively. In this experiment, following points are verified. Before heat annealing, the crystals at the ion-implanted region are damaged by the ion-implantation, so that surface recombination of carriers, photoinduced by the He-Ne laser is rapid (the surface recombination velocity S increases). Therefore, the maximum signal voltage at the ion-implanted region is weaker than the maximum voltage at the non-implanted region. After heat annealing at a temperature of 1000° C. for 60 minutes, the damage in the ion-implanted region can be seen to have been repaired. Furthermore, the implanted P+ ions are seen to restrict surface recombination. Therefore, the signal voltage at the ion-implanted region is stronger than the voltage at the ion-implanted region.

Thus, it is understood that the method using a He-Ne laser and measuring the maximum signal of detector 7 can detect the high-low junction as well as the method using a laser diode and calculating surface recombination velocity S. Furthermore, because only measuring the signal voltage of detector 7 is necessary, extremely rapid examination of the characteristics of the surface is possible. Consequently, the method using a He-Ne laser can be applied to the evaluation of semiconductor devices before and after ion-implantation, and before and after heat annealing in an actual semiconductor manufacturing process.

EXPERIMENT 5

Another experiment for comparison of the resolutions of a laser diode beam and a He-Ne laser beam was done. The condition are as follows:

The specimen is inscribed to have 2 scratched straight lines separated by 5 mm. These scratches mimic damage at conveying or scrubbing semiconductor wafers.

The laser beam from the laser diode is focused by an optical fiber whose core diameter is 50 $\mu$m.

The laser beam from the He-Ne laser has a diameter of 2 mm.

Figure 11:
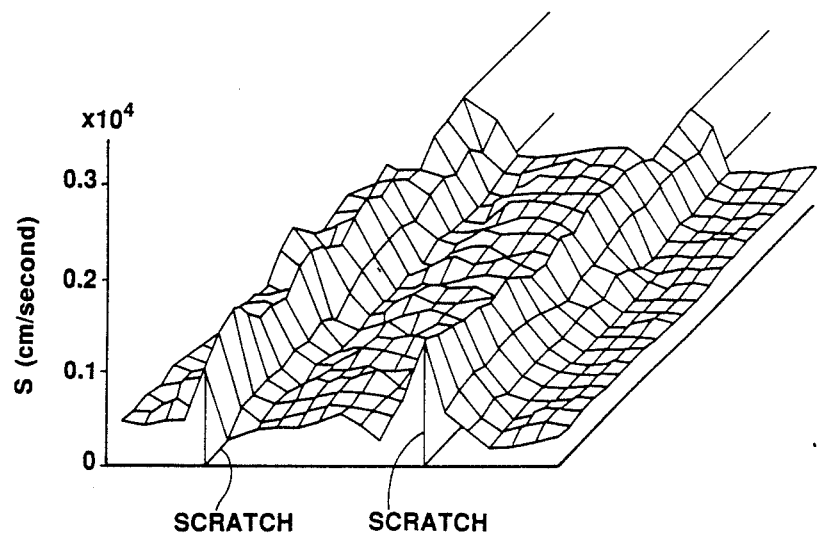
FIG. 11 is a graph showing the distribution of surface recombination velocity S on a wafer which has surface scratches, measured by the invention employing a laser diode for the light source.
Figure 12:
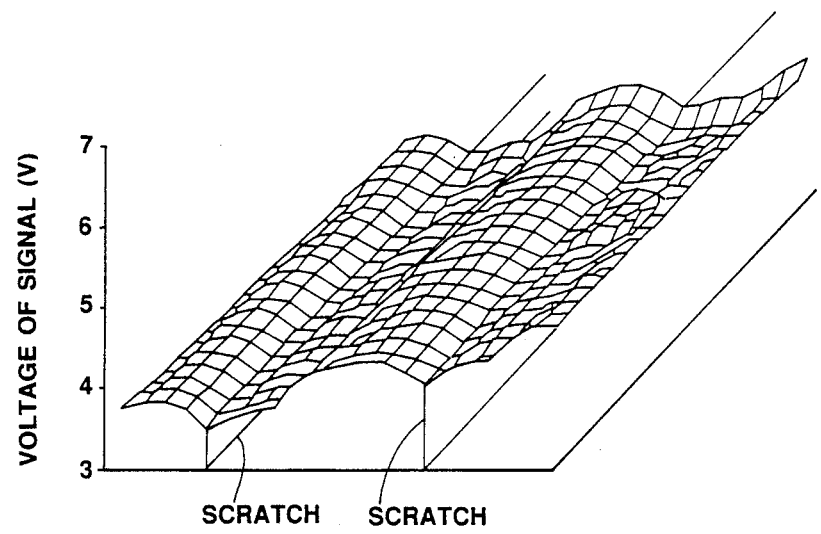
FIG. 12 is a graph showing the distribution of the signal voltage of detector 7 on the same wafer as in FIG. 11 measured by the invention employing a He-Ne laser for the light source.

FIG. 11 is a graph showing distribution of the surface recombination velocity S, which is calculated from measured lifetime $\tau_m$, of the specimen, respectively measured with a laser diode at a pitch of 500 $\mu$m. FIG. 12 is a graph showing distribution of the maximum signal voltage of the detector 7 on the specimen measured with a He-Ne laser at a pitch of 500 $\mu$m. In FIG. 11, the surface recombination velocity S deflects sharply at the scratch because the focused laser beam diameter is small. However, in FIG. 12, this effect is not as marked at the scratch because the He-Ne laser beam diameter is bigger. Accordingly, when the He-Ne laser beam is focused, surface recombination is relatively enhanced compared to the effect of a laser diode beam. Therefore higher sensitivity may be expected.

EXPERIMENT 6

The following is an experiment using a He-Ne laser for comparison between a focused and a non-focused laser beam.

The specimen is an originally n-type silicon wafer whose orientation is (1 1 1) and conductivity $\rho$ is equal to about 700 $\Omega$·cm. This silicon wafer's surface is implanted with P+ ions at a concentration of $10^{13}$ cm$^{-2}$ and at acceleration energy of 100 keV. Then, the wafer is heat annealed at 1000° C. for 60 minutes and the surface is inscribed by a straight scratch. The laser beam diameter is originally 1 mm. In the experiment, two measurements are done; one when the laser beam is focused to 1/10 of the original diameter and another when the laser beam is not focused. In both measurements, the distribution of the signal voltages from detector 7, at a pitch of 20 $\mu$m on the surface is obtained.

Figure 13:
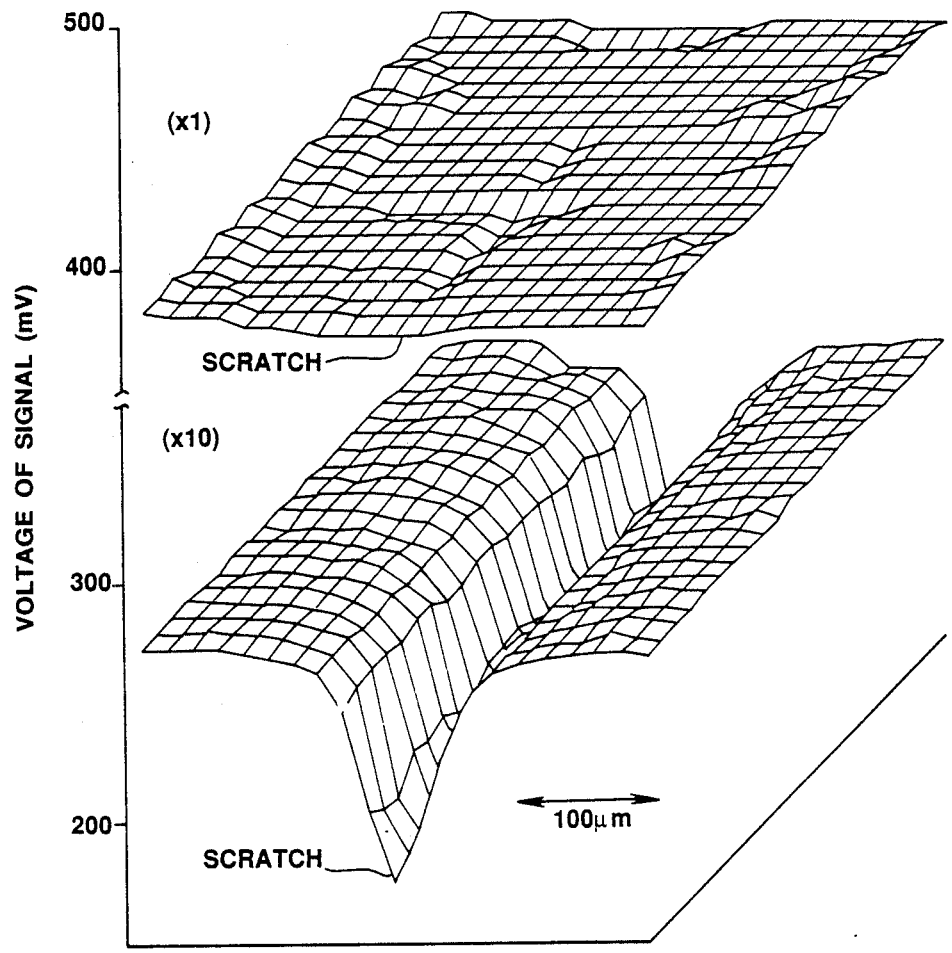
FIG. 13 is a graph showing the distribution of the signal voltage of detector 7 on a wafer which has surface scratches, measured by the invention, comparing a focused and unfocused He-Ne laser beam, for analyzing measurement solution.

FIG. 13 shows the result of the experiment. In FIG. 13, ($\times$10) designates the voltage-distribution using the 1/10 focused laser beam and ($\times$1) designates that using an unfocused laser beam. As shown in FIG. 13, in the case where the laser beam is not focused, the scratch is apparently not detected, since the large diameter beam lowers the sensitivity. In contrast, the focusing He-Ne laser beam results in apparent detection of the location of the scratch.

Therefore, it is recognized that focusing the He-Ne laser beam provides more accurate measurement for damage on the surface of the wafer.

EXPERIMENT 7

Figure 14:
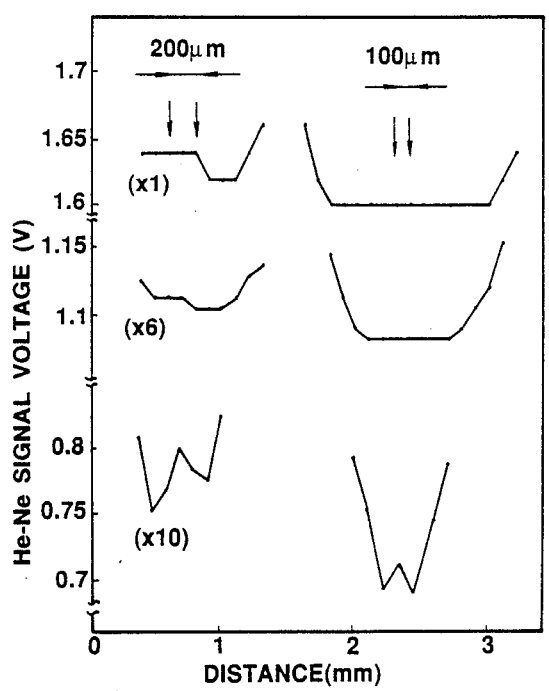
FIG. 14 is a graph showing the distribution of signal voltage of detector 7 on a wafer which has surface scratches measured by the invention comparing a focused and unfocused He-Ne laser beam for analyzing measuring solution.

In experiment 7, the specimen is inscribed with scratches spaced at intervals of 100 $\mu$m and 200 $\mu$m. Another experiment in then conducted to determine whether the scratches are detected or not, using a He-Ne laser beam with and without focusing. The diameter of the laser beam is originally 2 mm. In the experiment, three measurements are done; in the first, the laser beam is focused to 1/10 of its original diameter, in the second the laser beam is focused to 1/6 of its original diameter, in the third, the laser beam is not focused. In FIG. 14, ($\times$10) designates the voltage-distribution using the 1/10 focused laser beam, ($\times$6) designates using the 1/6 focused laser beam, and ($\times$1) designates using an unfocused laser beam.

The reason that reducing the diameter of the laser beam results in lower signal voltages is reduced irradiation areas. It is recognized that focusing the laser beam results in improvement in resolution for defecting scratches. When the interval between the scratches is 200 $\mu$m, forcing the laser beam to 1/10 results in the voltage at intermediate region between the scratches being equal to that of non-inscribed region. When the interval between the scratches is 100 $\mu$m, an unfocused laser beam or a laser beam focused to 1/6 results in the voltages at the intermediate area between the scratches, at the scratches, and in the non-inscribed regions being not very different. However, focusing the laser beam to 1/10 provides acceptable resolution. Consequently, it is recognized that focusing the He-Ne laser beam provides more accurate measurement for damage of the surface.

EXPERIMENT 8

In order to better establish the relation between surface recombination velocity S and the signal voltage from detector 7 in the case of a He-Ne laser beam, contamination at a surface of a semiconductor wafer is evaluated with a laser diode and a He-Ne laser.

The specimen is an n-type silicon wafer whose conductivity $\rho$ is more than 500 $\Omega$·cm and orientation is (100). Drops of 0.05 cm$^3$ of aqueous sodium chloride solutions at varying concentration on the specimen surface at random intervals. Then, the specimen is dried for 30 minutes at 50° C. The concentrations of the water solutions are 0, 0.001, 0.01, 0.1, and 1.0 in normality.

Figure 15:
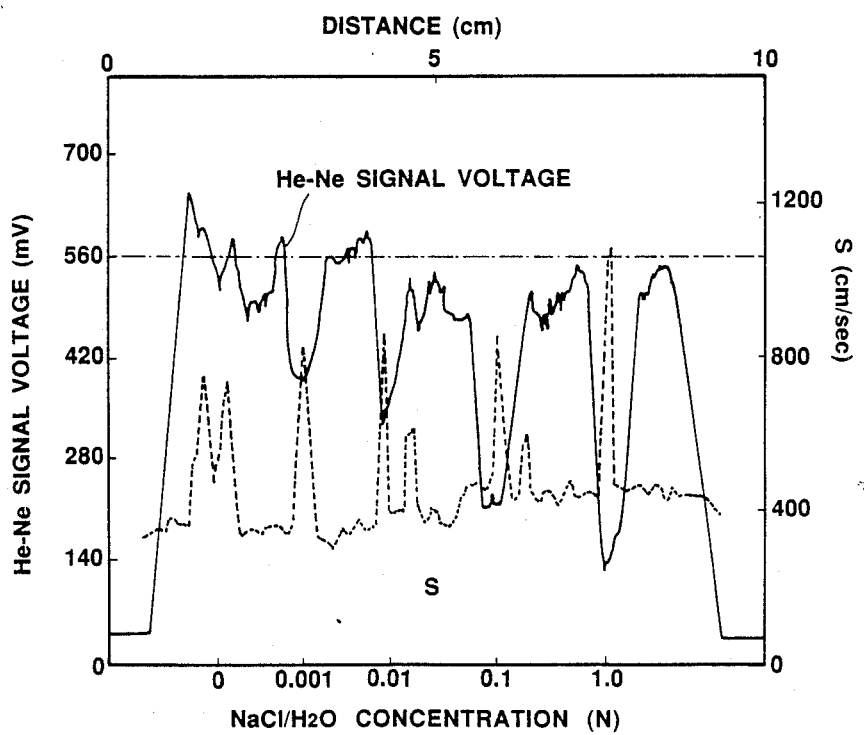
FIG. 15 is a graph showing the distribution of surface recombination velocity S measured with a laser diode, and the distribution of the signal voltage of detector 7 measured with He-Ne laser for a specimen whose surface is contaminated.

The results are shown in FIG. 15. Polygonal continuous lines and polygonal broken lines denote the signal voltage for the He-Ne laser beam and the calculated surface recombination velocity Sc for the laser diode beam, respectively. In this experiment, it is expected that Na+ ions restrict surface recombination to increase the signal voltage, and the higher the concentration, the more marked this trend.

As shown in FIG. 15, both polygonal lines represent increased ability of both method to detect the surface contamination. The voltage of the signal from detector 7 with the He-Ne laser has an apparent inverse relation to the surface recombination velocity S.

According to the above experiments, it is verified that measuring the voltage of the signal from detector 7 permits obtaining surface recombination velocity S. And, it is verified that this method can be applied to actual semiconductor manufacturing processes. Furthermore, it is verified that the method is useful for detecting damage during conveying or scrubbing wafers. It is possible to evaluate oxide layers or nitride layers which cover surfaces of silicon wafers and to evaluate the reactive ion etching process to partially remove these layers.

What is claimed is:

1. A method for contactless evaluation of characteristics of semiconductor wafers and devices, the method comprising the steps of:
   (a) continuously irradiating microwaves on a surface of a semiconductor specimen;
   (b) continuously receiving reflected microwaves reflected from said surface;
   (c) irradiating a laser beam pulse on the specimen, energy of the pulse being in excess of the band-gap energy of the semiconductor material; said laser beam pulse having a wavelength below the near infrared range; and
   (d) changing the characteristic of the reflected microwaves to an electrical signal for obtaining the intensity of the reflected microwaves at a predetermined moment;
   whereby said evaluation is made based on the obtained momentary intensity of the reflected microwaves, not on a time-history of the intensity of the reflected microwaves.

2. A method for contactless evaluation of characteristics of semiconductor wafers and devices according to claim 1, wherein said microwaves are focused and then irradiated on said surface.

3. A method for contactless evaluation of characteristics of semiconductor wafers and devices according to claim 2, wherein said laser beam pulse is focused by an optical system and then irradiated on said specimen.

4. A method for contactless evaluation of characteristics of semiconductor wafers and devices according to claim 3, wherein said optical system is an optical fiber.

5. A method for contaceless evaluation of characteristics of semiconductor wafers and devices according to claim 4, wherein said laser beam is emitted by a He-Ne laser.

6. A method for contactless evaluation of characteristics of semiconductor wafers and devices according to claim 4, wherein said laser beam is emitted by a He-Cd laser.

7. A method for contactless evaluation of characteristics of semiconductor wafers and devices according to claim 4, wherein said laser beam is emitted by a YAG laser.

8. A method for contactless evaluation of characteristics of semiconductor wafers and devices according to claim 4, wherein said laser beam is emitted by an Argon laser.

9. A method for contactless evaluation of characteristics of semiconductor wafers and devices according to claim 5 wherein said characteristic of said reflected microwaves is the phase.

10. A method for contactless evaluation of characteristics of semiconductor wafers and devices according to claim 6 wherein said characteristic of said reflected microwaves is the phase.

11. A method for contactless evaluation of characteristics of semiconductor wafers and devices according to claim 7 wherein said characteristic of said reflected microwaves is the phase.

12. A method for contactless evaluation of characteristics of semiconductor wafers and devices according to claim 8 wherein said characteristic of said reflected microwaves is the phase.

13. A method for contactless evaluation of characteristics of semiconductor wafers and devices according to claim 9, wherein said microwaves are focused by a waveguide which has a microwave portal and a microwave passage tapering to the portal.

14. A method for contactless evaluation of characteristics of semiconductor wafers and devices according to claim 13, said method further comprising output the maximum value of the electrical signal.

15. A method for contactless evaluation of characteristics of semiconductor wafers and devices, the method comprising the steps of:
   (a) continuously irradiating microwaves on a surface of a semiconductor specimen;
   (b) continuously receiving reflected microwaves reflected from said surface;
   (c) irradiating a laser beam pulse on the specimen, energy of the pulse being in excess of the band-gap energy of the semiconductor material; said laser beam pulse having a wavelength less than that of the near infrared range; and
   (d) changing the characteristic of the reflected microwaves from a plurality of points on the surface to respective electrical signals for obtaining the intensity of the reflected microwaves at a predetermined moment from each said plurality of points, thereby obtaining electrical signals corresponding to respective surface recombination velocities S at said points; whereby the surface condition of the specimen can be evaluated based on the obtained momentary intensity of the reflected microwaves at said points, not on a time-history of the intensity of the reflected microwaves at said points.

16. A method for contactless evaluation of characteristics of semiconductor wafers and devices according to claim 15, wherein said microwaves are focused and then irradiated on said surface.

17. A method for contactless evaluation of characteristics of semiconductor wafers and devices according to claim 16, wherein said laser beam pulse is focused by an optical system and then irradiated on said specimen.

18. A method for contactless evaluation of characteristics of semiconductor wafers and devices according to claim 17, wherein said optical system is an optical fiber.

19. A method for contactless evaluation of characteristics of semiconductor wafers and devices according to claim 18, wherein said laser beam is emitted by a He-Ne laser.

20. A method for contactless evaluation of characteristics of semiconductor wafers and devices according to claim 18, wherein said laser beam is emitted by a He-Cd laser.

21. A method for contactless evaluation of characteristics of semiconductor wafers and devices according to claim 18, wherein said laser beam is emitted by a YAG laser.

22. A method for contactless evaluation of characteristics of semiconductor wafers and devices according to claim 18 wherein said laser beam is emitted by an Argon laser.

23. A method for contactless evaluation of characteristics of semiconductor wafers and devices according to claim 19 wherein said characteristic of said reflected microwaves is the phase.

24. A method for contactless evaluation of characteristics of semiconductor wafers and devices according to claim 20 wherein said characteristic of said reflected microwaves is the phase.

25. A method for contactless evaluation of characteristics of semiconductor wafers and devices according to claim 21 wherein said characteristic of said reflected microwaves is the phase.

26. A method for contactless evaluation of characteristics of semiconductor wafers and devices according to claim 22 wherein said characteristic of said reflected microwaves is the phase.

27. A method for contactless evaluation of characteristics of semiconductor wafers and devices according to claim 23, wherein said microwaves are focused by a waveguide which has a microwave portal and a microwave passage tapering to the portal.

28. A method for contactless evaluation of characteristics of semiconductor wafers and devices according to claim 27, said method further comprising output of the maximum value of the electrical signal.

* * * * *